United States Patent
Loeb et al.

(10) Patent No.: US 8,599,962 B1
(45) Date of Patent: Dec. 3, 2013

(54) POWER CONTROL USING DISTORTION MEASUREMENT

(75) Inventors: Wayne A. Loeb, San Francisco, CA (US); David M. Signoff, Mountain View, CA (US)

(73) Assignee: Marvell International Ltd., Hamilton (BM)

(*) Notice: Subject to any disclaimer, the term of this patent is extended or adjusted under 35 U.S.C. 154(b) by 185 days.

(21) Appl. No.: 13/170,791

(22) Filed: Jun. 28, 2011

Related U.S. Application Data

(60) Provisional application No. 61/365,239, filed on Jul. 16, 2010.

(51) Int. Cl.
*H04K 1/02* (2006.01)
*H04B 1/04* (2006.01)

(52) U.S. Cl.
USPC .................................. 375/296; 455/127.2

(58) Field of Classification Search
USPC ......... 375/295, 296, 219, 316, 285, 260, 259; 455/91, 114.2, 114.3, 127.1, 127.2; 330/278, 149; 332/106, 107, 149, 159, 332/117, 123
See application file for complete search history.

(56) References Cited

U.S. PATENT DOCUMENTS

| | | | |
|---|---|---|---|
| 2003/0117215 A1* | 6/2003 | O'Flaherty et al. | 330/149 |
| 2004/0179629 A1* | 9/2004 | Song et al. | 375/296 |
| 2007/0057737 A1* | 3/2007 | Davis et al. | 331/17 |
| 2009/0316826 A1* | 12/2009 | Koren et al. | 375/296 |
| 2010/0225390 A1* | 9/2010 | Brown et al. | 330/149 |
| 2010/0273431 A1* | 10/2010 | Fraser et al. | 455/67.11 |

* cited by examiner

*Primary Examiner* — Sam K. Ahn
*Assistant Examiner* — Vineeta Panwalkar

(57) ABSTRACT

Apparatus having corresponding methods and non-transitory computer-readable media comprise: a transmitter configured to transmit a signal according to a gain setting, wherein the signal represents a first digital signal; a receiver configured to receive the signal transmitted by the transmitter, and produce a second digital signal based on the signal received by the receiver; a measurement module configured to produce a digital indication of a linearity of the transmitter based on the second digital signal; and a gain setting module configured to control the gain setting in accordance with the digital indication of the linearity of the transmitter.

21 Claims, 7 Drawing Sheets

POWER CONTROL USING DISTORTION MEASUREMENT

CROSS-REFERENCE TO RELATED APPLICATIONS

This disclosure claims the benefit of U.S. Provisional Patent Application Ser. No. 61/365,239, entitled "Transmit Power Control Using Distortion Measurement," filed on Jul. 16, 2010, the disclosure thereof incorporated by reference herein in its entirety.

FIELD

The present disclosure relates generally to the field of electronic data communication. More particularly, the present disclosure relates to controlling the transmitted power level of a signal representing digital data.

BACKGROUND

The performance of a transmitter depends upon the transmitted power level. As the transmitted power increases beyond a certain level, distortion degrades the transmitted signal. This distortion results in data loss, high bit error rates, and the like. To prevent these effects, power control schemes have been developed.

Two common power control schemes are open loop power control and closed loop power control. In both schemes the goal is to maintain a target output power level at the transmitter. However, both schemes have drawbacks. In either scheme, any known power level error must be subtracted from the target power level to avoid exceeding specified maximum power levels. This can result in unnecessarily low transmitted power levels. Furthermore, other factors such as temperature, voltage standing wave ratio (VSWR), and the like can cause large errors, especially for open loop power control schemes.

To directly address the distortion problem, pre-distortion schemes have been developed. According to these schemes, the distortion produced by the transmitter is measured, and then applied inversely to the source signal, before feeding the source signal to the transmitter. Both analog and digital pre-distortion schemes have been developed. FIG. 1 shows a conventional digital pre-distortion scheme.

Referring to FIG. 1, a digital signal source 102 produces a digital signal 104. A digital pre-distortion (DPD) module 106 pre-distorts digital signal 104 based on DPD information 108 provided by DPD training module 110. A digital-to-analog converter (DAC) 112 converts pre-distorted digital signal 114 to an analog signal 116. Transmitter 118 transmits a signal 120 that represents analog signal 116. Transmitter 118 transmits signal 120 at a power level specified by a gain setting 122 provided by a gain setting module 124. A receiver 126 receives signal 120 and produces a second analog signal 128 based on signal 120. An analog-to-digital converter (ADC) 130 converts second analog signal 128 to a second digital signal 132. DPD training module 110 produces DPD information 108 based on a comparison of digital signals 104 and 132.

SUMMARY

In general, in one aspect, an embodiment features an apparatus comprising: a transmitter configured to transmit a signal according to a gain setting, wherein the signal represents a first digital signal; a receiver configured to receive the signal transmitted by the transmitter, and produce a second digital signal based on the signal received by the receiver; a measurement module configured to produce a digital indication of a linearity of the transmitter based on the second digital signal; and a gain setting module configured to control the gain setting in accordance with the digital indication of the linearity of the transmitter.

Embodiments of the apparatus can include one or more of the following features. In some embodiments, the digital indication of the linearity of the transmitter comprises at least one of digital pre-distortion information; an error vector magnitude of the signal received by the receiver; and a spectral mask of the signal received by the receiver. In some embodiments, the measurement module comprises: an error vector magnitude detector configured to measure the error vector magnitude. In some embodiments, the measurement module comprises: a spectral mask detector configured to measure the spectral mask. In some embodiments, the gain setting module is further configured to control the gain setting based on at least one of a measured power level of the signal received by the receiver, a voltage of a power supply of the apparatus, and a temperature of the apparatus. In some embodiments, the measurement module comprises: a power detector configured to measure the power level. In some embodiments, the measurement module comprises: a voltage detector configured to measure the voltage of the power supply. In some embodiments, the measurement module comprises: a temperature detector configured to measure the temperature. Some embodiments comprise a digital pre-distortion module configured to produce the first digital signal based on a third digital signal and digital pre-distortion information; wherein the digital indication of the linearity of the transmitter comprises the digital pre-distortion information; and wherein the measurement module includes a digital pre-distortion training module configured to produce the digital pre-distortion information based on the third digital signal and the second digital signal. Some embodiments comprise a digital signal source configured to provide the third digital signal. In some embodiments, the digital pre-distortion module comprises: a digital filter configured to produce the first digital signal based on the third digital signal and a polynomial; wherein the digital pre-distortion information specifies values for coefficients of the polynomial; and wherein the gain setting module is further configured to set the gain setting to a maximum value that keeps the values of the coefficient within predetermined ranges. In some embodiments, the digital pre-distortion information represents differences between corresponding samples of the second digital signal and the third digital signal. Some embodiments comprise a communication device comprising the apparatus.

In general, in one aspect, an embodiment features a method comprising: transmitting a signal, from a transmitter, according to a gain setting, wherein the signal represents a first digital signal; receiving the transmitted signal; producing a second digital signal based on the received signal; producing a digital indication of a linearity of the transmitter based on the second digital signal; and controlling the gain setting in accordance with the digital indication of the linearity of the transmitter.

Embodiments of the method can include one or more of the following features. In some embodiments, the digital indication of the linearity of the transmitter comprises at least one of digital pre-distortion information; an error vector magnitude; and a spectral mask. Some embodiments comprise controlling the gain setting based on at least one of a measured power level of the signal received by the receiver, a voltage of a power supply of an apparatus comprising the transmitter, and a temperature of the apparatus. Some embodiments comprise producing the first digital signal based on a third digital signal and digital pre-distortion information, wherein the digital indication of the linearity of the transmitter comprises the digital pre-distortion information; and producing the digital pre-distortion information based on the third digital signal and the second digital signal. Some embodiments comprise producing the first digital signal based on the third digital signal and a polynomial, wherein the digital pre-distortion information specifies values for coefficients of the polynomial; and setting the gain setting to a maximum value that keeps the values of the coefficient within predetermined ranges. In some embodiments, the digital pre-distortion information represents differences between corresponding samples of the second digital signal and the third digital signal.

In general, in one aspect, an embodiment features non-transitory computer-readable media embodying instructions executable by a computer to perform functions comprising: controlling a gain setting of a transmitter of a signal in accordance with a digital indication of a linearity of the transmitter; wherein the signal represents a first digital signal; wherein the digital indication of the linearity of the transmitter is based on a second digital signal; and wherein the second digital signal is based on the signal.

The details of one or more implementations are set forth in the accompanying drawings and the description below. Other features will be apparent from the description and drawings, and from the claims.

Figure 1:
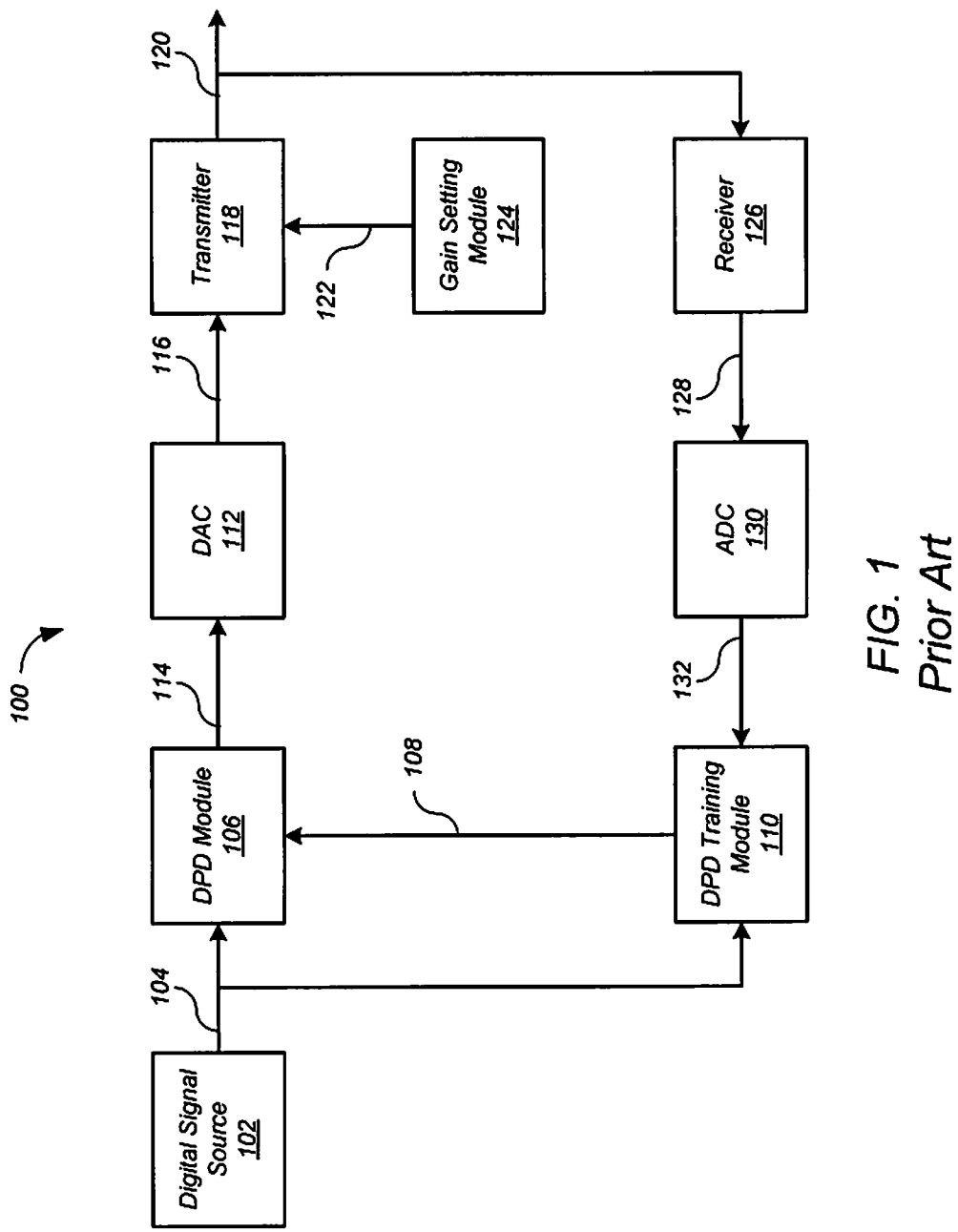
FIG. 1 shows a conventional digital pre-distortion scheme.

The leading digit(s) of each reference numeral used in this specification indicates the number of the drawing in which the reference numeral first appears.

DETAILED DESCRIPTION

Embodiments of the present disclosure provide transmit power control using distortion measurement. In particular, various embodiments obtain digital indications of the linearity of the transmitter, and control the gain of the transmitter based on those indications. Linearity describes the extent to which the output of the transmitter is proportional to the input. The digital indications of linearity can include digital pre-distortion information, error vector magnitudes, spectral masks, and the like.

Figure 2:
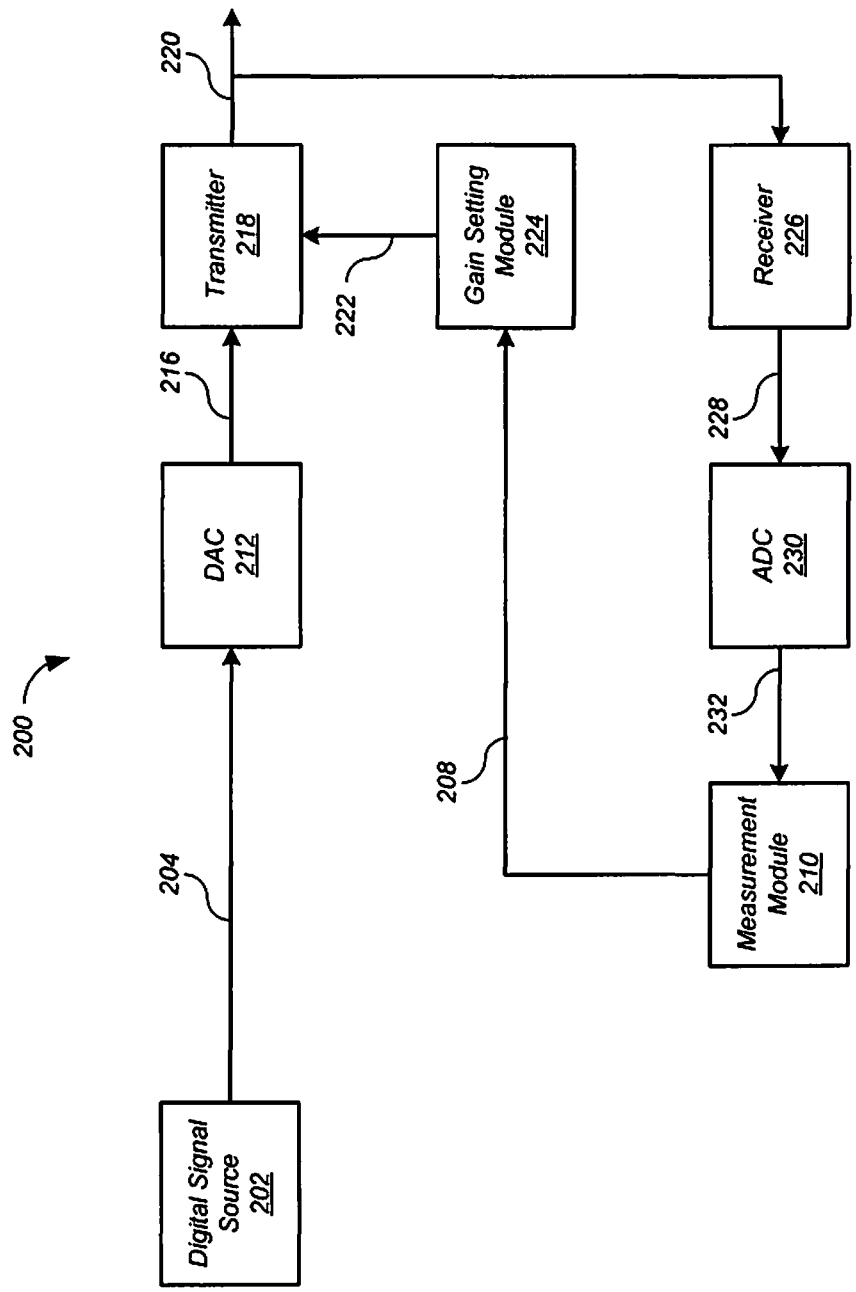
FIG. 2 shows elements of a communication device according to an embodiment where transmitter gain is controlled according to digital indications of the linearity of the transmitter.

FIG. 2 shows elements of a communication device 200 according to an embodiment where transmitter gain is controlled according to digital indications of the linearity of the transmitter. Although in the described embodiments the elements of communication device 200 are presented in one arrangement, other embodiments may feature other arrangements. For example, elements of communication device 200 can be implemented in hardware, software, or combinations thereof. Furthermore, communication device 200 can communicate wirelessly or over wireline, optical cable or the like.

Referring to FIG. 2, communication device 200 includes a digital signal source 202, a digital-to-analog converter (DAC) 212, a transmitter 218, a gain setting module 224, a receiver 226, an analog-to-digital converter (ADC) 230, and a measurement module 210.

Digital signal source 202 produces a digital signal 204. Digital signal 204 can represent any sort of data. DAC 212 converts digital signal 204 to an analog signal 216. Transmitter 218 transmits a signal 220 that represents analog signal 216. For example, signal 220 can be a radio-frequency signal or the like. Transmitter 218 transmits signal 220 at a power level specified by a gain setting 222 provided by gain setting module 224. Receiver 226 produces a second analog signal 228 based on signal 220. ADC 230 converts second analog signal 228 to a second digital signal 232. Measurement module 210 produces a digital indication 208 of the linearity of transmitter 218 based on digital signal 232. Digital indication 208 can include digital pre-distortion information, error vector magnitudes, spectral masks, and the like. Digital predistortion information describes how the digital signal 204 to be transmitted should be pre-distorted to compensate for the distortion caused by the transmitter 218. An error vector magnitude is a measure of the difference between the constellation points of the digital signal 204 to be transmitted and the ideal constellation points for the transmitter. A spectral mask describes the spectrum of the transmitted signal 220, and can be compared to an ideal spectral mask to obtain a measure of the distortion of the transmitter 218.

In contrast to existing power control schemes, gain setting module 224 controls gain setting 222 in accordance with digital indication 208. In some embodiments, gain setting module 224 controls gain setting 222 in accordance with other factors in addition to digital indication 208. These factors can include a measured power level of signal 220 received by receiver 226, a voltage of a power supply of communication device 200, a temperature of communication device 200, and the like.

Figure 3:
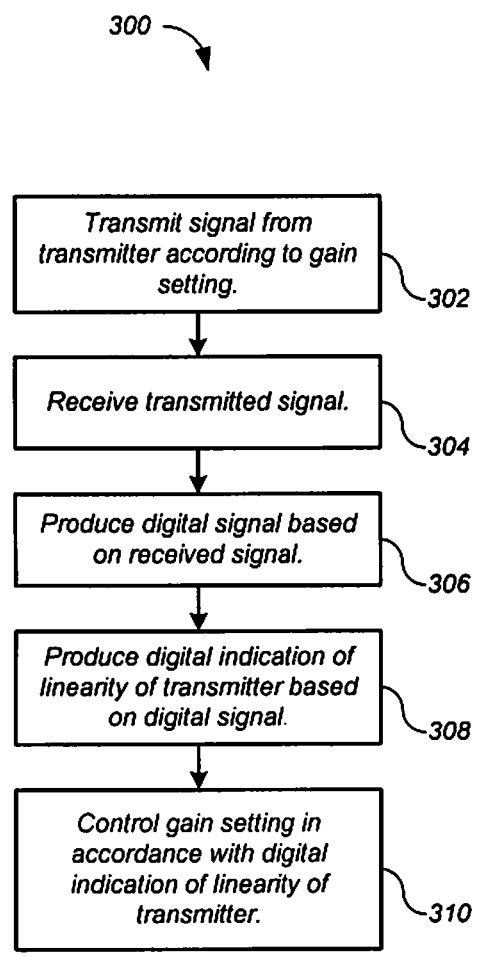
FIG. 3 shows a process for the communication device of FIG. 2 according to one embodiment.

FIG. 3 shows a process 300 for communication device 200 of FIG. 2 according to one embodiment. Although in the described embodiments the elements of process 300 are presented in one arrangement, other embodiments may feature other arrangements. For example, in various embodiments, some or all of the elements of process 300 can be executed in a different order, concurrently, and the like.

Referring to FIG. 3, at 302 transmitter 218 transmits signal 220 according to gain setting 222. Signal 220 represents digital signal 204. At 304, receiver 226 receives signal 220. At 306, ADC 230 produces digital signal 232 based on signal 220. At 308, measurement module 210 produces digital indication 208 of the linearity of transmitter 218 based on digital signal 232. At 310, gain setting module 224 controls gain setting 222 in accordance with digital indication 208 of the linearity of transmitter 218.

Figure 4:
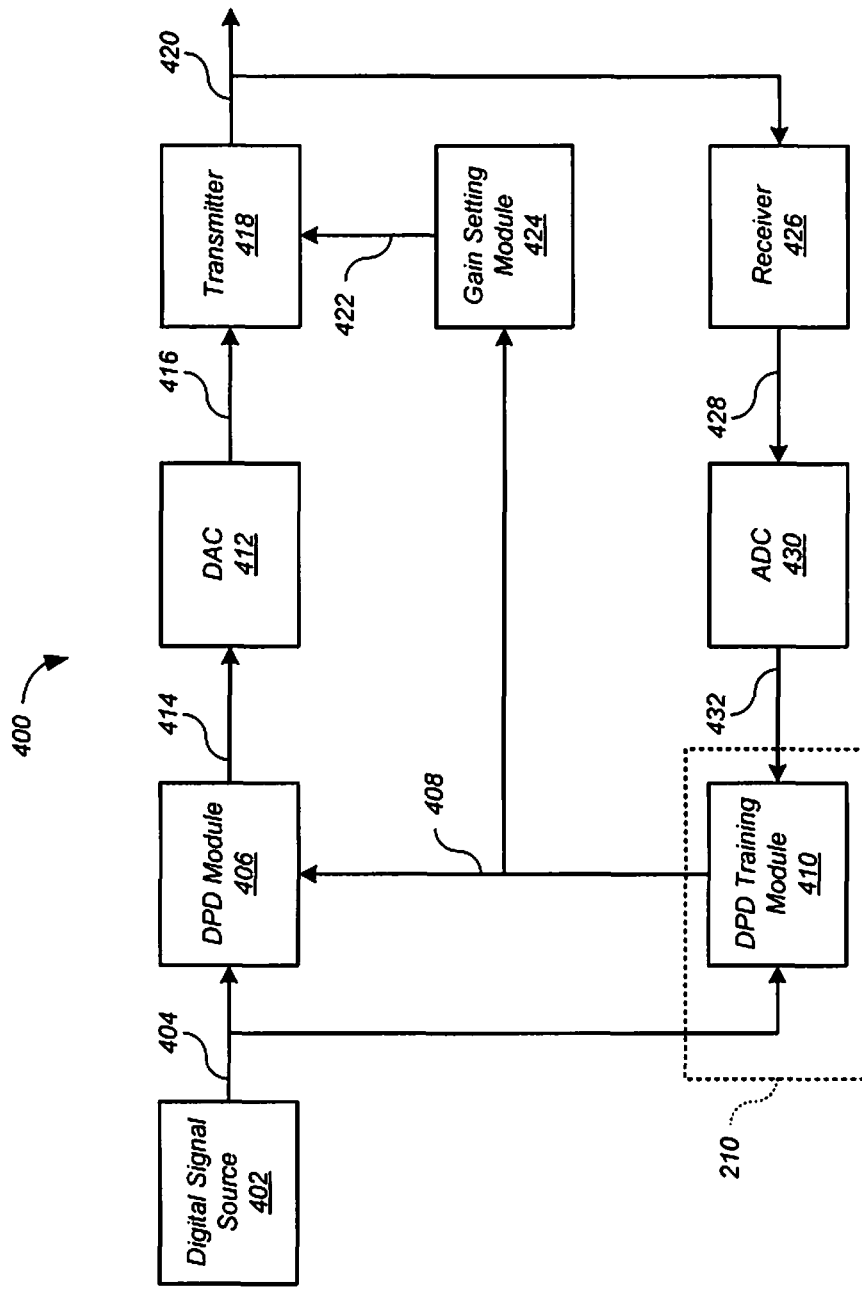
FIG. 4 shows elements of a communication device according to an embodiment where transmitter gain is controlled according to digital pre-distortion information.

FIG. 4 shows elements of a communication device 400 according to an embodiment where transmitter gain is controlled according to digital pre-distortion information. Although in the described embodiments the elements of communication device 400 are presented in one arrangement, other embodiments may feature other arrangements. For example, elements of communication device 400 can be implemented in hardware, software, or combinations thereof. Furthermore, communication device 400 can communicate wirelessly or over wireline, optical cable or the like.

Referring to FIG. 4, communication device 400 includes a digital signal source 402, a digital pre-distortion (DPD) module 406, a digital-to-analog converter (DAC) 412, a transmitter 418, a gain setting module 424, a receiver 426, an analog-to-digital converter (ADC) 430, and measurement module 210. In communication device 400, measurement module 210 includes a DPD training module 410, and the digital indication of linearity 208 produced by measurement module 210 includes DPD information 408.

Digital signal source 402 produces a digital signal 404. Digital signal 404 can represent any sort of data. DPD module 406 pre-distorts digital signal 404 based on DPD information 408 provided by DPD training module 410. DAC 412 converts pre-distorted digital signal 414 to an analog signal 416. Transmitter 418 transmits a signal 420 that represents analog signal 416. For example, signal 420 can be a radio-frequency signal or the like. Transmitter 418 transmits signal 420 at a power level specified by a gain setting 422 provided by gain setting module 424. Receiver 426 produces a second analog signal 428 based on signal 420. ADC 430 converts second analog signal 428 to a second digital signal 432. DPD training module 410 produces DPD information 408 based on a comparison of digital signals 402 and 432.

In contrast to existing power control schemes, gain setting module 424 generates gain setting 422 based on DPD information 408. In some embodiments, DPD module 406 includes a digital filter configured to produce digital signal 414 based on digital signal 404 and a polynomial. In such embodiments, DPD information 408 specifies values for coefficients of the polynomial, and gain setting module 424 generates gain setting 422 based on the values of those coefficients. For example, gain setting module 424 can set gain setting 422 to the maximum value that keeps the coefficient values within predetermined ranges. As another example, gain setting module 424 can implement a cost function or the like to produce a single value based on the coefficient values, and can set gain setting 422 to the maximum value that keeps that value within a predetermined range. In some embodiments, DPD information 408 represents differences between corresponding samples of digital signal 414 and digital signal 404. In such embodiments, gain setting module 424 can set gain setting 422 to the maximum value that keeps the differences within a predetermined range. In some embodiments, DPD information 408 is conveyed in other ways. In various embodiments, gain setting module 424 can set gain setting 422 using an iterative approach, or in one shot.

Figure 5:
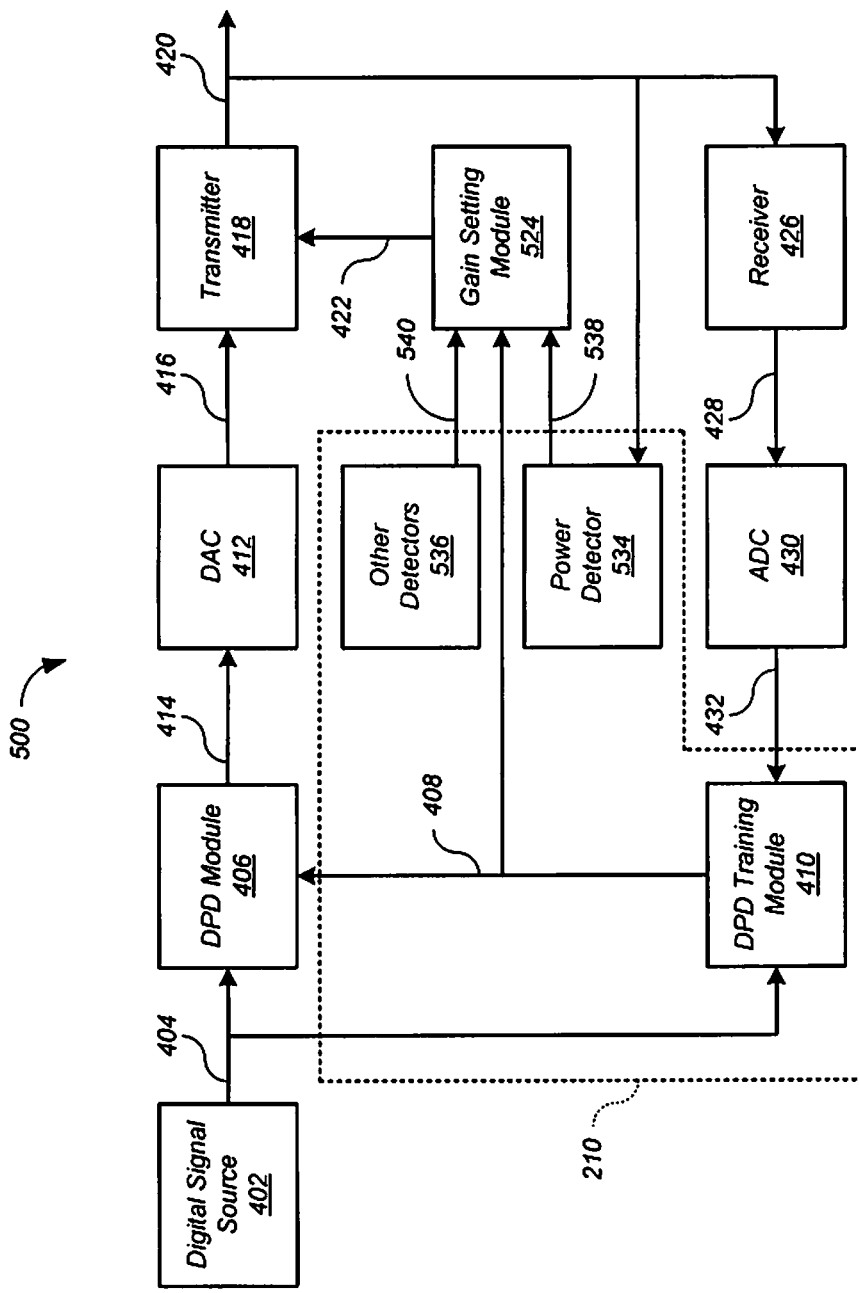
FIG. 5 shows elements of a communication device according to an embodiment where transmitter gain is controlled according to digital pre-distortion information and other factors.

FIG. 5 shows elements of a communication device 500 according to an embodiment where transmitter gain is controlled according to digital pre-distortion information and other factors. Although in the described embodiments the elements of communication device 500 are presented in one arrangement, other embodiments may feature other arrangements. For example, elements of communication device 500 can be implemented in hardware, software, or combinations thereof. Furthermore, communication device 500 can communicate wirelessly or over wireline, optical cable or the like.

Referring to FIG. 5, communication device 500 includes a gain setting module 524, measurement module 210 includes DPD training module 410, a power detector 534 and other detectors 536, and the digital indication of linearity 208 produced by measurement module 210 includes DPD information 408, a power level indication 538, and indications 540 of other measurements. The remaining elements of communication device 500 are described above with reference to FIG. 4. Referring again to FIG. 5, power detector 534 measures a power level of signal 420 received by receiver 426, and provides an indication 538 of the power level to gain setting module 524. Other detectors 536 measure other factors, such as a voltage of a power supply of communication device 500, a temperature of communication device 500, and the like, and provide indications 540 of these measurements to gain setting module 524. Gain setting module 524 generates gain setting 422 based on DPD information 408 and indications 538 and 540. Gain setting module 524 can use the indication 538 of the power level to implement maximum and/or minimum power levels. A maximum power level can be set, for example, to comply with FCC restrictions. A minimum power level can be set, for example, to try a different modulation scheme/data rate when the power level goes below the minimum level. Indications 540 can also be used to adjust the output power level, for example to allow for ongoing gain adjustments between DPD training sessions. For example the gain can be changed in response to a temperature change, according to a known relationship between temperature and gain, to maintain a constant power level.

Figure 6:
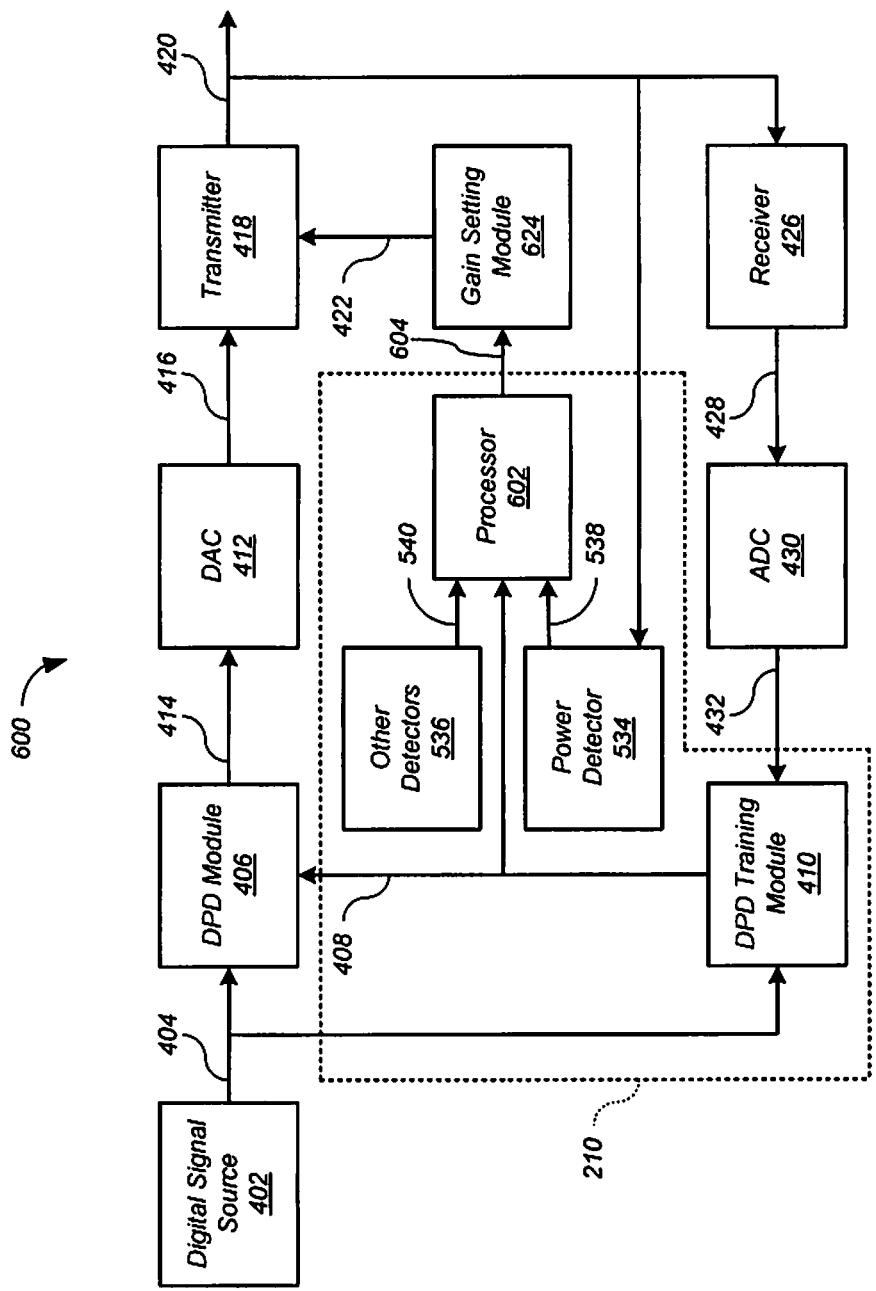
FIG. 6 shows elements of a communication device according to an embodiment where transmitter gain is controlled by a processor according to digital pre-distortion information and other factors.

FIG. 6 shows elements of a communication device 600 according to an embodiment where transmitter gain is controlled by a processor according to digital pre-distortion information and other factors. Although in the described embodiments the elements of communication device 600 are presented in one arrangement, other embodiments may feature other arrangements. For example, elements of communication device 600 can be implemented in hardware, software, or combinations thereof. Furthermore, communication device 600 can communicate wirelessly or over wireline, optical cable or the like.

Referring to FIG. 6, communication device 600 includes a gain setting module 624; measurement module 210 includes DPD training module 410, power detector 534, other detectors 536, and a processor 602; and the digital indication of linearity 208 produced by measurement module 210 includes a gain control signal 604 that is based on DPD information 408, a power level indication 538, and indications 540 of other measurements. The remaining elements of communication device 600 are described above with reference to FIGS. 4 and 5. Referring again to FIG. 6, DPD training module 410 provides DPD information 408 to processor 602. Power detector 534 measures a power level of signal 420 received by receiver 426, and provides an indication 538 of the power level to processor 602. Other detectors 536 measure other factors, such as a voltage of a power supply of communication device 600, a temperature of communication device 600, and the like, and provide indications 540 of these measurements to processor 602. Processor 602 provides a gain control signal 604 to gain setting module 524 based on DPD information 408 and indications 538 and 540. Gain setting module 524 generates gain setting 422 based on gain control signal 604. Processor 602 performs calculations based on based on DPD information 408 and indications 538 and 540, while gain setting module 624 provides a hardware interface between processor 602 and transmitter 418.

Figure 7:
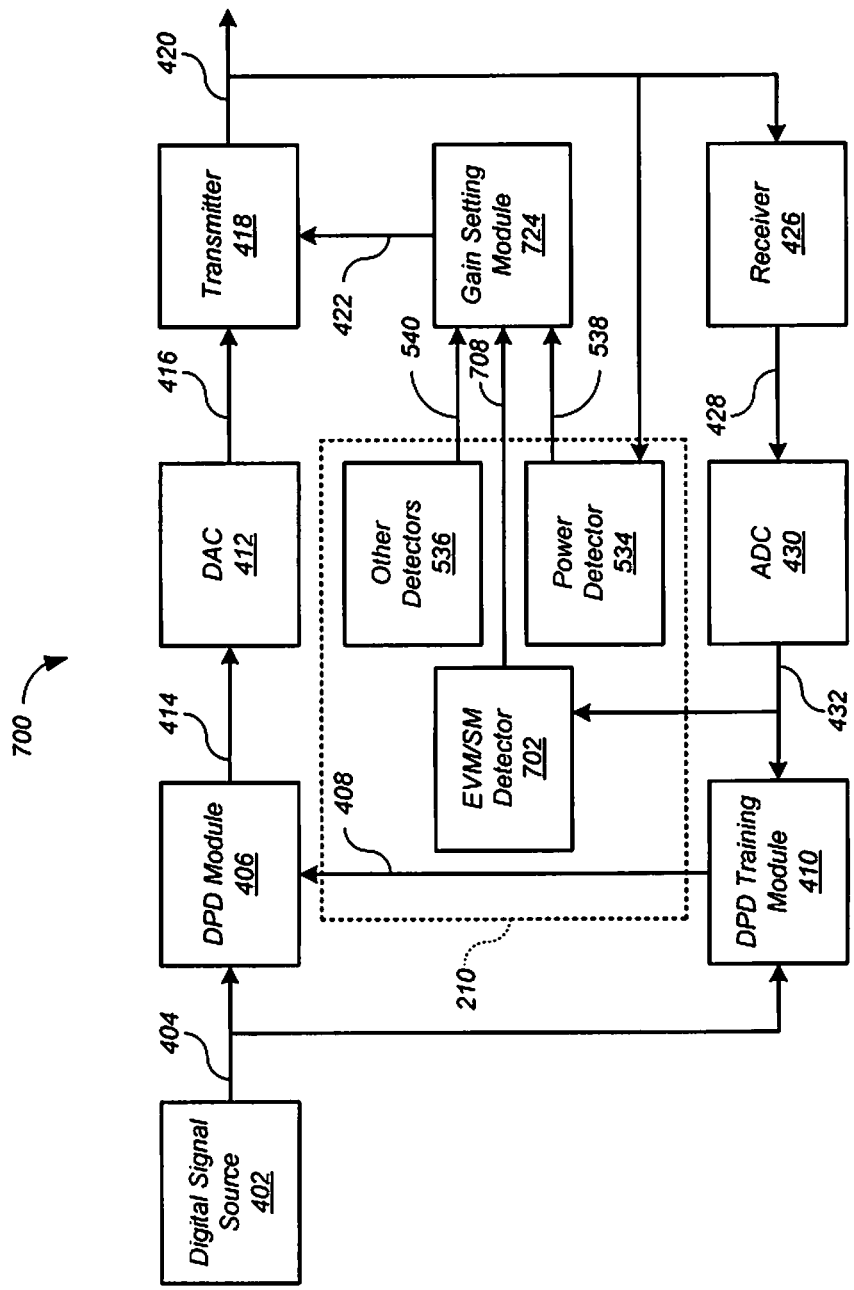
FIG. 7 shows elements of a communication device according to an embodiment where transmitter gain is controlled according to measurements of error vector magnitudes and/or spectral masks.

FIG. 7 shows elements of a communication device 700 according to an embodiment where transmitter gain is controlled according to measurements of error vector magnitudes and/or spectral masks. Although in the described embodiments the elements of communication device 700 are presented in one arrangement, other embodiments may feature other arrangements. For example, elements of communication device 700 can be implemented in hardware, software, or combinations thereof. Furthermore, communication device 700 can communicate wirelessly or over wireline, optical cable or the like.

Referring to FIG. 7, communication device 700 includes a gain setting module 724; measurement module 210 includes power detector 534, other detectors 536, and an error vector magnitude/spectral mask (EVM/SM) detector 702; and the digital indication of linearity 208 produced by measurement module 210 includes power level indication 538, indications 540 of other measurements, and EVM/SM measurements 708. The remaining elements of communication device 700 are described above with reference to FIGS. 4 and 5. Referring again to FIG. 7, EVM/SM detector 702 measures an error vector magnitude and/or spectral mask of signal 420 received by receiver 426, and provides an indication 708 of the measurements to gain setting module 724. Gain setting module 724 generates gain setting 422 based on indication 708 and indications 538 and 540. For example, gain setting module 724 can set gain setting 422 to the maximum gain that keeps the EVM and/or spectral mask within predetermined requirements. Gain setting in this manner can be implemented using an iterative or one-shot approach, and can be combined with indications 538 and 540 to limit the maximum and/or minimum transmitter power. Indications 540 can be used to adjust those maximum/minimum values.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus comprising:
a filter configured to (i) receive an input signal, and (ii) based on coefficients of a polynomial, filter the input signal to generate a first digital signal;
a transmitter configured to transmit an analog signal according to a gain of the transmitter, wherein the analog signal is based on the first digital signal;
a receiver configured to (i) receive the analog signal transmitted by the transmitter, and (ii) output a second digital signal based on the analog signal received by the receiver;
a measurement module configured to, based on the second digital signal, generate a linearity signal indicative of a linearity of the transmitter; and
a gain module configured to (i) receive the linearity signal, and (ii) control the gain of the transmitter according to the linearity signal,
wherein the gain module is configured to set the gain of the transmitter to a predetermined value to maintain the coefficients of the polynomial within respective predetermined ranges.

2. The apparatus of claim 1, wherein the linearity signal comprises at least one of:
pre-distortion information including the coefficients of the polynomial;
a magnitude of an error vector of the analog signal received by the receiver; or
a spectral mask of the analog signal received by the receiver.

3. The apparatus of claim 2, wherein:
the magnitude of the error vector of the analog signal is based on a difference between (i) constellation points of the first digital signal and (ii) predetermined constellation points of the transmitter;
the measurement module comprises a detector; and
the detector is configured to determine the magnitude of the error vector of the analog signal.

4. The apparatus of claim 2, wherein:
the spectral mask is indicative of a spectrum of the analog signal;
the measurement module comprises a spectral mask detector; and
the spectral mask detector is configured to determine the spectral mask.

5. The apparatus of claim 1, wherein the gain module is configured to control the gain of the transmitter based on at least one of:
a power level of the analog signal received by the receiver;
a voltage of a power supply of the apparatus; or
a temperature of the apparatus.

6. The apparatus of claim 5, wherein:
the measurement module comprises a power detector; and
the power detector is configured to measure the power level of the analog signal received by the receiver.

7. The apparatus of claim 5, wherein:
the measurement module comprises a voltage detector; and
the voltage detector is configured to measure the voltage of the power supply.

8. The apparatus of claim 5, wherein:
the measurement module comprises a temperature detector; and the temperature detector is configured to measure the temperature.

9. The apparatus of claim 1, further comprising a pre-distortion module configured to, based on the input signal and pre-distortion information, generate the first digital signal, wherein:
the pre-distortion module is configured to, based on the pre-distortion information, pre-distort the first digital signal to compensate for distortion caused by the transmitter;
the linearity signal comprises the pre-distortion information;
the measurement module includes a training module;
the training module is configured to, based on the input signal and the second digital signal, provide the pre-distortion information; and
the pre-distortion information includes the coefficients of the polynomial.

10. The apparatus of claim 9, further comprising a source configured to generate the input signal.

11. The apparatus of claim 9, wherein the pre-distortion information is indicative of differences between samples of the second digital signal and (ii) corresponding samples of the input signal.

12. A communication device comprising the apparatus of claim 1.

13. The apparatus of claim 1, wherein:
the measurement module is configured to determine the coefficients of the polynomial based on the second digital signal; and
the linearity signal comprises the coefficients of the polynomial.

14. An apparatus comprising:
a transmitter configured to transmit a signal according to a gain setting, wherein the signal represents a first digital signal;
a receiver configured to
receive the signal transmitted by the transmitter, and
produce a second digital signal based on the transmitted signal received by the receiver;
a measurement module configured to produce a digital indication of a linearity of the transmitter based on the second digital signal;
a gain setting module configured to control the gain setting in accordance with the digital indication of the linearity of the transmitter; and
a digital pre-distortion module configured to produce the first digital signal based on a third digital signal and digital pre-distortion information,
wherein
the digital indication of the linearity of the transmitter comprises the digital pre-distortion information,
the measurement module includes a digital pre-distortion training module configured to produce the digital pre-distortion information based on the third digital signal and the second digital signal,
the digital pre-distortion module comprises a digital filter,
the digital filter is configured to produce the first digital signal based on the third digital signal and a polynomial,
the digital pre-distortion information specifies values for coefficients of the polynomial, and
the gain setting module is further configured to set the gain setting to a maximum value that keeps the values of the coefficient within predetermined ranges.

15. A method comprising:
receiving an input signal;
based on coefficients of a polynomial, filtering the input signal to generate a first digital signal;
generating an analog signal based on the first digital signal;
transmitting the analog signal from a transmitter and according to a gain of the transmitter;
receiving the analog signal transmitted by the transmitter;
generating a second digital signal based on the received analog signal;
based on the second digital signal, generating a linearity signal indicative of a linearity of the transmitter, wherein the linearity signal comprises the coefficients of the polynomial; and
controlling the gain of the transmitter according to the linearity signal.

16. The method of claim 15, wherein the linearity signal comprises at least one of:
pre-distortion information including the coefficients of the polynomial;
a magnitude of an error vector of the analog signal; or
a spectral mask of the analog signal.

17. The method of claim 15, further comprising controlling the gain of the transmitter based on at least one of:
a power level of the analog signal;
a voltage of a power supply of an apparatus comprising the transmitter; or
a temperature of the apparatus.

18. The method of claim 15, further comprising:
based on the input signal and pre-distortion information, generating the first digital signal, wherein the linearity signal comprises the pre-distortion information; and
based on the input signal and the second digital signal, generating the pre-distortion information, wherein the pre-distortion information comprises the coefficients of the polynomial.

19. A method comprising:
transmitting a signal, from a transmitter, according to a gain setting, wherein the signal represents a first digital signal;
receiving the transmitted signal;
producing a second digital signal based on the received transmitted signal;
producing a digital indication of a linearity of the transmitter based on the second digital signal;
controlling the gain setting in accordance with the digital indication of the linearity of the transmitter;
producing the first digital signal based on a third digital signal and digital pre-distortion information, wherein the digital indication of the linearity of the transmitter comprises the digital pre-distortion information;
producing the digital pre-distortion information based on the third digital signal and the second digital signal;
producing the first digital signal based on the third digital signal and a polynomial, wherein the digital pre-distortion information specifies values for coefficients of the polynomial; and
setting the gain setting to a maximum value that keeps the values of the coefficient within predetermined ranges.

20. The method of claim 18, wherein the pre-distortion information is indicative of differences between (i) samples of the second digital signal and (ii) corresponding samples of the input signal.

21. The method of claim 15, further comprising setting the gain of the transmitter to a maximum value to maintain the coefficients of the polynomial within respective predetermined ranges.

* * * * *